US008010572B1

(12) United States Patent
Mazzagatti et al.

(10) Patent No.: US 8,010,572 B1
(45) Date of Patent: Aug. 30, 2011

(54) KSTORE SCENARIO SIMULATOR PROCESSOR AND XML FILE

(75) Inventors: Jane C. Mazzagatti, Blue Bell, PA (US); Tony Phan, Abington, PA (US)

(73) Assignee: Unisys Corporation, Blue Bell, PA (US)

( * ) Notice: Subject to any disclaimer, the term of this patent is extended or adjusted under 35 U.S.C. 154(b) by 614 days.

(21) Appl. No.: 11/985,623

(22) Filed: Nov. 16, 2007

Related U.S. Application Data

(63) Continuation-in-part of application No. 10/666,382, filed on Sep. 19, 2003, now Pat. No. 7,158,975, and a continuation-in-part of application No. 11/185,620, filed on Jul. 20, 2005, now abandoned.

(51) Int. Cl.
*G06F 17/30* (2006.01)
(52) U.S. Cl. ........................................ 707/797; 707/810
(58) Field of Classification Search .................. 707/102, 707/797, 810
See application file for complete search history.

(56) References Cited

U.S. PATENT DOCUMENTS

| 6,792,432 B1* | 9/2004 | Kodavalla et al. | 1/1 |
| 6,961,733 B2* | 11/2005 | Mazzagatti | 707/102 |
| 2003/0097650 A1* | 5/2003 | Bahrs et al. | 717/124 |
| 2003/0140333 A1* | 7/2003 | Odaka et al. | 717/115 |

* cited by examiner

*Primary Examiner* — Jean B. Fleurantin
*Assistant Examiner* — Dennis Myint
(74) *Attorney, Agent, or Firm* — Richard J. Gregson; Robert P. Marley

(57) ABSTRACT

A scenario simulator processor receives a declarative file and invokes one or more data simulators to create one or more datastreams from a data structure may be built as specified by the declarative file. The declarative file may specify one or more scenario names, and a set of information corresponding to the one or more scenarios (one set for each scenario). Each set of scenario information includes one or more of the following pieces of information: parameters and settings for the data simulator and the number of threads to be started for each data simulator invoked.

19 Claims, 7 Drawing Sheets

| TAG | DATA |
|---|---|
| StartConfiguration 302<br>StartSelection 306<br>StartApplication 310<br>StartArguments 314 | title of wrapper 304<br>name of scenario 308<br>executable for simulator 312<br>settings (parameters)316<br>threads 318 |

KSTORE SCENARIO SIMULATOR PROCESSOR AND XML FILE

This application, is a continuation-in-part, and claims the benefit of U.S. patent application Ser. No. 10/666,382, filed Sep. 19, 2003, now U.S. Pat. No. 7,158,975 entitled "SYSTEM AND METHOD FOR STORING AND ACCESSING DATA IN AN INTERLOCKING TREES DATASTORE" and, is a continuation-in-part, and claims the benefit of U.S. patent application Ser. No. 11/185,620, filed Jul. 20, 2005, now abandoned entitled "METHOD FOR PROCESSING NEW SEQUENCES BEING RECORDED INTO AN INTERLOCKING TREES DATASTORE".

BACKGROUND

The process of developing and testing software continues to increase in complexity. In fact, applications can take so long to build, much less test, that requirements can change before the application is completed, resulting in wasted time or worse, wasted time and an unusable system. To address the software development aspects of these problems, Rapid Application Development (RAD) was introduced. RAD refers to a process intended to speed up the development process. It is based on concepts of iterative development, construction of prototypes, and use of Computer-Aided Software Engineering (CASE) tools. The RAD approach typically involves compromises in usability, features, and/or execution speed. Although use of the RAD approach often increases the speed of development and reduces complexity, end-user functionality often suffers because of a narrower design focus, and frequently scalability is lost.

RAD tools typically require a design-and-code phase which is taken to some degree of completion, and then the code is compiled and linked into an executable file before testing with (typically simulated) data during a runtime phase. Thus, a developer has to wait until runtime to see if the application works as expected. If it does not, development returns to the design-and-code phase and the process continues.

Software testing includes the process of executing a program or application with the intent of finding errors and is intended to measure the quality of the developed software. It also encompasses providing information about the quality of the product with respect to the context in which it is intended to operate. Although there are many approaches to software testing, effective testing of complex products depends on using test data that faithfully reflects the type of data upon which the software will act and using that data in an environment like the one in which the software will run. Hence it may be helpful to design and test scenarios, where a scenario may be described as an instantiation of a use case (taking a specific path through the model, and assigning context-specific values to each variable). More complex tests can be built up by designing a test that runs through a series of scenarios. Unfortunately, obtaining or generating such data for scenario testing is not easy. Even if "live data" is available, security considerations may render that data unavailable.

SUMMARY

A scenario simulator processor receives a declarative file and invokes one or more data simulators to create one or more datastreams of scenario-specific data from which a data structure may be built as specified by the declarative file. The declarative file may specify one or more scenario names, and a set of information corresponding to the one or more scenarios (one set for each scenario). Each set of scenario information includes one or more of the following pieces of information: parameters and settings for the data simulator, and the number of threads to be started for each data simulator invoked.

DETAILED DESCRIPTION

Overview

Figure 1:
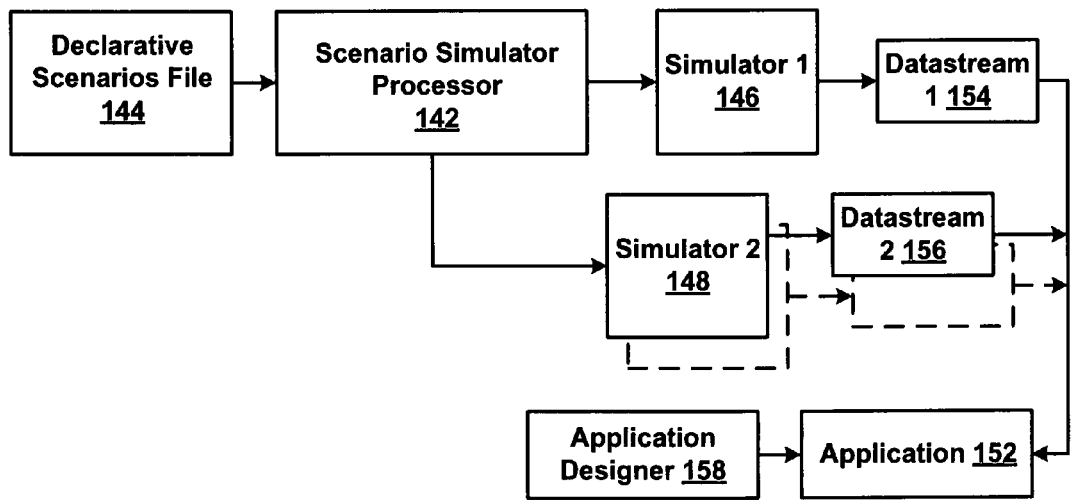
FIG. 1 is a block diagram illustrating a system for generating and processing scenario data in accordance with some embodiments of the invention.

Creating and using interlocking trees datastores and various features of interlocking trees datastore systems (referred to herein as "KStore" or just "K") have been described in U.S. Pat. Nos. 6,961,733, and 7,158,975, by inventor Mazzagatti and are hereby incorporated herein in their entireties. A system in which such interlocking trees datastores can be used has been described in U.S. patent application Ser. No. 10/879,329 entitled "Functional operations for accessing and/or building interlocking trees datastores to enable their use with applications software," which is hereby incorporated by reference in its entirety. Embodiments of the invention described herein can be adapted to operations described in U.S. Pat. No. 7,213,041 and in co-pending U.S. patent application Ser. No. 10/759,466 (now published as US 20050165749) entitled "Saving and restoring an interlocking trees datastore" and U.S. Pat. No. 7,213,041, all of which are hereby incorporated by reference in their entireties. An application designer is described in co-pending U.S. patent application Ser. No. 11/373,730 entitled "Kstore Application Designer" and is hereby incorporated by reference in its entirety.

Embodiments of the invention described herein use a declarative file (such as an XML file adhering to an XML schema or some other type of declarative file) to input directives to a scenario simulator processor so that the datastream(s) or datastream(s)/data structure that is created represents a desired scenario. In some embodiments of the invention, a developer, using object-oriented drag and drop methods, is able to build and test a custom GUI application that incorporates and associates KStore analytics with live, static or dynamic data representing a desired scenario, as specified by the declarative file. Unlike known systems, embodiments of the declarative file-driven KStore scenario simulator processor described herein comprise a single step: that is, test data generation, application designing and testing occur together in one single phase, so that a developer can generate test data, design an application and test the application at the same time, using production data that has been loaded into KStore and is based on a contemplated context or scenario. Because the system uses KStore access APIs to access the interlocking trees datastore, the KStore datastore is protected from accidental corruption by the application being developed. The developer does not have to wait for runtime to determine whether or not the application works as desired. Because the developer can use data simulating a particular use (scenario data), it is instantly obvious (as the application is being built) if the analytics are working with the data as desired and if the GUI design shows the data properly.

Embodiments of the KStore application designer also provide the ability to develop applications rapidly without having to understand how a KStore is built or accessed. By creating a declarative file that is used to specify the generation of datastream(s) reflective of real data in a real context, a developer can build a data store that reflects the particular characteristics of a user's data and context. Embodiments of the invention can include a graphical user interface (GUI) that provides a workspace on which to view the structure built according to the directives provided in the declarative file and alter the structure on-the-fly. Furthermore, because the directives provided to the scenario simulator processor are provided via a declarative file, a developer does not need to be a programmer or to understand the technical aspects of the KStore data structure to build a data store that captures the characteristics of a particular universe of data. Although described in relation to KStore, it should be readily apparent that embodiments described herein may also be applicable to similar data structures developed in the future.

Scenario Simulator Processor and Declarative File

A scenario simulator processor receives a declarative file and invokes one or more data simulators to create one or more datastreams. In some embodiments of the invention, a data structure may be built from the datastream(s) specified by the declarative file. The declarative file may specify: a title for an external wrapper, one or more scenario names, and a set of information corresponding to the one or more scenarios (one set for each scenario). Each set of scenario information includes one or more of the following pieces of information: parameters and settings for the data simulator and the number of threads to be started for each data simulator invoked. In some embodiments of the invention, the datastream(s) is/are processed by an application, which can be modified or created via an application designer while the datastreams are being produced. In some embodiments of the invention, the datastream(s) are used to generate or build a data structure and the data structure is processed by an application, which can be modified or created via an application designer while the datastreams are being produced and the data structure is being built.

FIG. 1 illustrates an example of a system for processing scenarios in accordance with some embodiments of the invention. Scenario simulator processor 142 receives a declarative scenarios file 144 and invokes one or more simulators 146, 148, etc. to generate one or more datastreams, 154, 156, etc. Datastreams 154, 156, etc. may be acted upon by an application 152 as the datastreams are generated. In some embodiments of the invention a data structure (not shown) is created from the one or more datastreams 154, 156, etc. The resultant data structure may be acted upon by an application as the datastreams 154, 156, etc. are generated and the data structure is being generated or built. In some embodiments of the invention, an application designer 158 may create or modify the application 152 as the datastreams 154, 156, etc. are being generated or as the datastreams 154, 156, etc. are being generated and a data structure (not shown) is being built. In some embodiments the declarative scenarios file 144 is an XML file as described below.

Figure 2A:
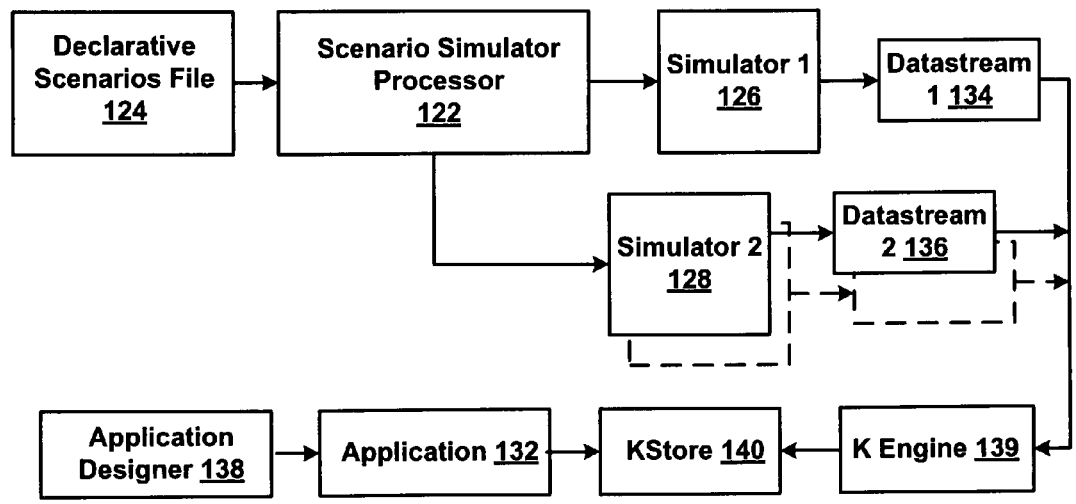
FIGS. 2a and 2b are block diagrams illustrating systems for generating and processing scenario data in which a KStore data structure is built in accordance with some embodiments of the invention.

FIG. 2a illustrates another example of a scenario simulator processor in accordance with some embodiments of the invention. Scenario simulator processor 122 receives a declarative scenarios file 124 and invokes one or more data simulators 126, 128, etc. to generate one or more datastreams 134, 136, etc. for input to a K Engine 139 to create a KStore data structure 140. The resultant KStore data structure 140 may be acted upon by an application 132 as the datastreams 134, 136, etc. are generated and the KStore data structure 140 is being built. In some embodiments of the invention, an application designer 138 may create and/or modify the application 132 while the datastreams 134, 136, etc are generated and the KStore data structure 140 is being generated. In some embodiments the declarative scenarios file 124 is an XML file as described below.

Declarative scenarios file 144, 124 may define one or more data simulator scenarios and in some embodiments of the invention is a manually created file that is used to define simulator datastreams as described above. Alternatively, an application to assist in the creation of the declarative file may be used. In some embodiments of the invention, the data structure 140 comprises a KStore or K, as described in U.S. Pat. Nos. 6,961,733, and 7,158,975. In some embodiments, declarative scenarios file 124 is an XML file and adheres to an XML schema although other types of declarative files may be used, including XML, BXML, UIML, XUL, SVG, 13ML, XAML, VTML, GTK+, MXML, LZX, or other known or yet-to-be-developed language.

Figures 2B, 3:
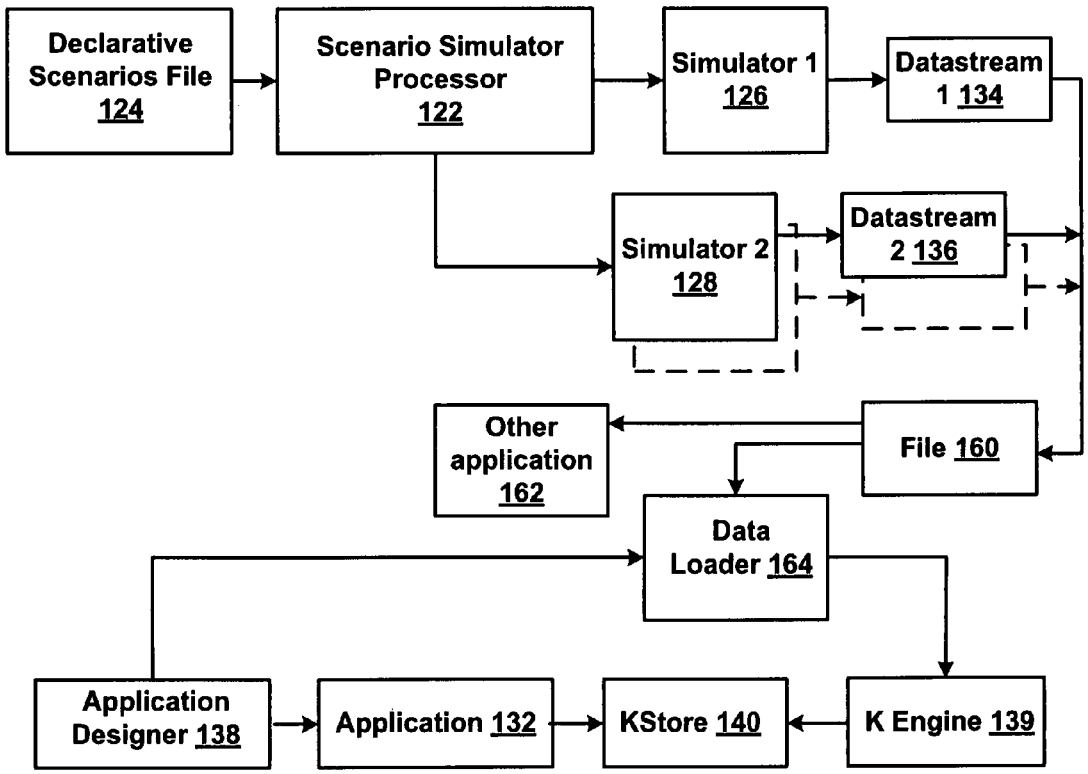
FIG. 3 is an illustration of a sample scenarios file in accordance with some embodiments of the invention.

FIG. 2b illustrates another example of a scenario simulator processor in accordance with some embodiments of the invention. Scenario simulator processor 122 receives a declarative scenarios file 124 and invokes one or more data simulators 126, 128, etc. to generate one or more datastreams 134, 136, etc. In these embodiments, the datastream(s) 134, 136, etc. are persisted to a file 160 for input to an application 162 or for input to a data loader 164 for operation upon by an application designer 138 or K Engine 139 to create a KStore data structure 140. The resultant KStore data structure 140 may be acted upon by an application 132 as the datastreams 134, 136, etc. are generated and the KStore data structure 140 is being built. In some embodiments of the invention, an application designer 138 may create and/or modify the application 132 while the datastreams 134, 136, etc are generated and the KStore data structure 140 is being generated. In some embodiments the declarative scenarios file 124 is an XML file as described below.

Declarative scenarios 124 of FIG. 2b may define one or more data simulator scenarios and in some embodiments of the invention is a manually created file that is used to define simulator datastreams as described above. Alternatively, an application to assist in the creation of the declarative file may be used. In some embodiments of the invention, the data structure 140 comprises a KStore or K, as described in U.S. Pat. Nos. 6,961,733, and 7,158,975. In some embodiments, declarative scenarios file 124 is an XML file and adheres to an XML schema although other types of declarative files may be used, including XML, BXML, UIML, XUL, SVG, 13ML, XAML, VTML, GTK+, MXML, LZX, or other known or yet-to-be-developed languages.

FIG. 3 illustrates the components of a declarative scenarios file according to some embodiments of the invention. One example of an XML scenarios file is:

```
<?xml version="1.0" encoding="us-ascii" ?>
<StartConfiguration Title="Start Scenario Simulation">
<StartSelection Name="Store Demo">
    <StartApplication>KSimm.exe</StartApplication>
    <StartArguments>-SETTINGS   "Store.Txt"-THREADS 1</StartArguments>
</StartSelection>
</StartConfiguration>
```

It will be appreciated that the particular names shown and variable values used above are illustrative only and any suitable version of XML, type of encoding, number of threads, identifiers for the wrapper, scenario names, executables, and arguments, etc. may be specified.

The above XML scenarios file provides a title for the external wrapper ("Start Scenario Simulation"), names the scenario ("Store Demo"), identifies the simulator to be executed ("KSimm.exe") and specifies a file ("Store.Txt") that includes settings and parameters to be provided to the simulator(s) 106, 108, etc. It also indicates the number of threads to be initiated ("1"). The line:

```
<?xml version="1.0" encoding="us-ascii" ?>
``` specifies the version of XML to use ("1.0") and the type of data encoding to be used ("us-ascii"). The line:

```
<StartConfiguration Title="Start Scenario Simulation">
``` specifies the name of the outer wrapper. The line:

```
<StartSelection Name="Store Demo">
``` establishes the name that will be displayed in the scenario list of the application designer. The line:

```
<StartApplication>KSimm.exe</StartApplication>
``` invokes an instance of the data simulator, (e.g., simulator 106). It will be appreciated that the type of data generated by the simulator(s) is not restricted to text, field or record data. A simulator as contemplated may generate sound data (e.g. .wav files, .mpeg files and the like), image data (e.g., .gif, .tiff, .bmp, .jpeg and the like), video data (e.g., .mjpeg, .mpeg and the like) and so on.

The line:

```
<StartArguments>-SETTINGS   "Store.Txt"-THREADS 1</StartArguments>
``` establishes the Store.txt file as the file that includes the arguments or parameters and settings for the data simulator 106 and indicates the number of threads to be initiated (in this example, one). A thread (sometimes called an execution context or a lightweight process) is a single sequential flow of control within a process. A thread can be thought of as the basic unit of CPU scheduling representing a sequential execution stream within a process of a program. In contrast, a process is typically defined to include code, data, stack, file I/O and signal tables so that a significant amount of overhead is created when switching between processes. Threads reduce overhead by sharing fundamental parts, thus decreasing the amount of overhead incurred when switching execution from one thread to another thread. As used above, the term "thread" indicates a software process that handles a simulator function from its initiation to its termination.

The line:

```
</StartSelection>
``` ends the scenario. To add additional scenarios, the lines:

```
<StartSelection Name="[name]">
<StartApplication>KSimm.exe</StartApplication>
<StartArguments>-SETTINGS   "[parameters].txt"-THREADS [number of threads]</StartArguments>
``` are repeated for each additional scenario to be added. Any number of additional scenarios may be added. The line:

```
</StartConfiguration>
``` signifies the end of the XML file

In some embodiments of the invention, the scenario simulator processor 122 accesses the scenarios file 124 and displays the scenario names in a scenario window of the administration drawer of a GUI toolbox, from which scenarios can be initiated. If so initiated, one or more simulators are invoked. Each simulator may have one or more threads, as specified by the THREADS integer. Each simulator thus may create a datastream that is provided to an application (as shown in FIG. 1) or to a K engine (as shown in FIG. 2) which builds the KStore according to the directives provided in the declarative scenarios file 104 or 124. Hence, the scenario simulator processor 102 or 122 may simulate simple or complex user data so as to model a desired scenario, based on the directives received by the declarative scenarios file.

A single scenario simulator may provide one or more datastreams in one data format. Multiple scenario simulators may provide one or more datastreams in one or more data formats. The multiple datastreams in one or multiple data formats may be provided in real time and may be provided simultaneously. In some embodiments the scenario simulator processor can randomly generate instances of data sequences based upon supplied configuration data, data from backing stores or from other sources, including simulator-generated sources and non-simulator generated real world data. The scenario simulator processor may continue to provide randomly generated sets of data until it provides one instance of every possible combination or may continue to generate sets of data indefinitely, and may generate duplicate data. Additionally, the simulator can assign default probability values to variables or accept probability values from a user or other source.

FIG. 3 illustrates a structure of a declarative file in accordance with embodiments of the invention. In some embodiments of the invention, the declarative file is an extensible file type in which tags label the content of the data in the file. In FIG. 3, a Start Configuration tag 302 labels the data that follows it as data representing the title of the external wrapper 304. A StartSelection tag 306 labels the data that follows it as the name of the scenario 308. A StartApplication tag 310 labels the data that follows it as the executable for the simulator 312. A StartArguments tag 314 labels the data that follows it as the settings or parameters 316 characterizing the scenario. A THREADS variable 318 specifies the number of threads to initiate for the scenario, as described more fully above.

Figure 4:
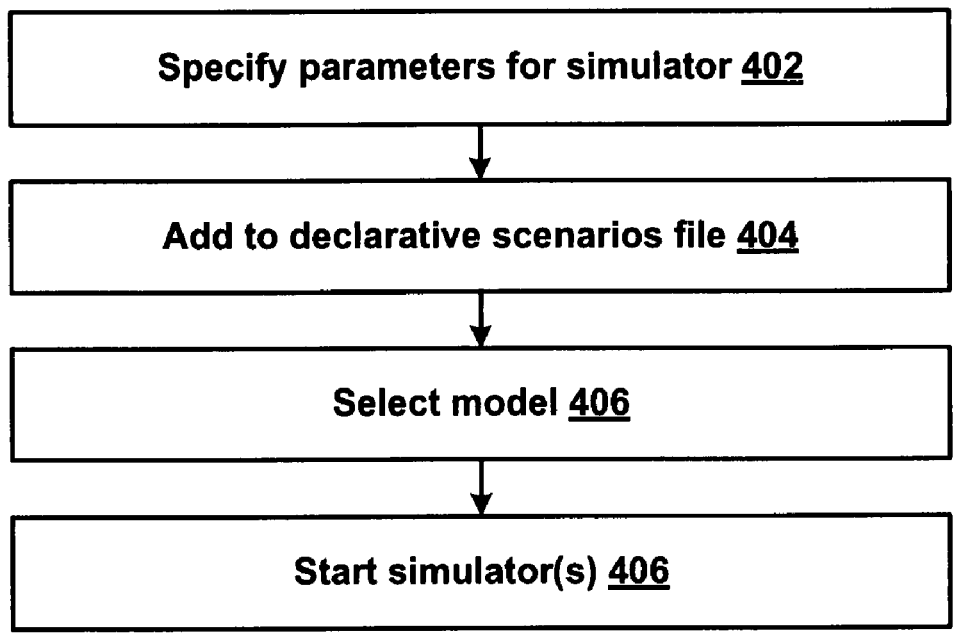
FIG. 4 is a flow diagram of a process for processing scenarios in accordance with some embodiments of the invention.

FIG. 4 illustrates a process for creating a scenario representing the characteristics of a particular universe of data. At 402 parameters and settings are specified for the simulator(s). In some embodiments of the invention, a text file with a file extension of .txt is created for these parameters and settings. Alternatively the parameters and settings may be specified within the scenario file. A scenario name is established for the scenario and the scenario name and the parameters and settings file name is added to the declarative scenarios file at 404. At 406 either an existing model is selected or a new model name is specified and a new model is created. At 408, the simulator(s) is started. In some embodiments of the invention, a simulator(s) is initiated by selecting a toolbox option, an administration option within the toolbox and a scenarios option with the administration option. Upon selection of the desired scenario, the building of the data structure is initiated. In some embodiments of the invention, the data structure built is a KStore.

Figure 8:
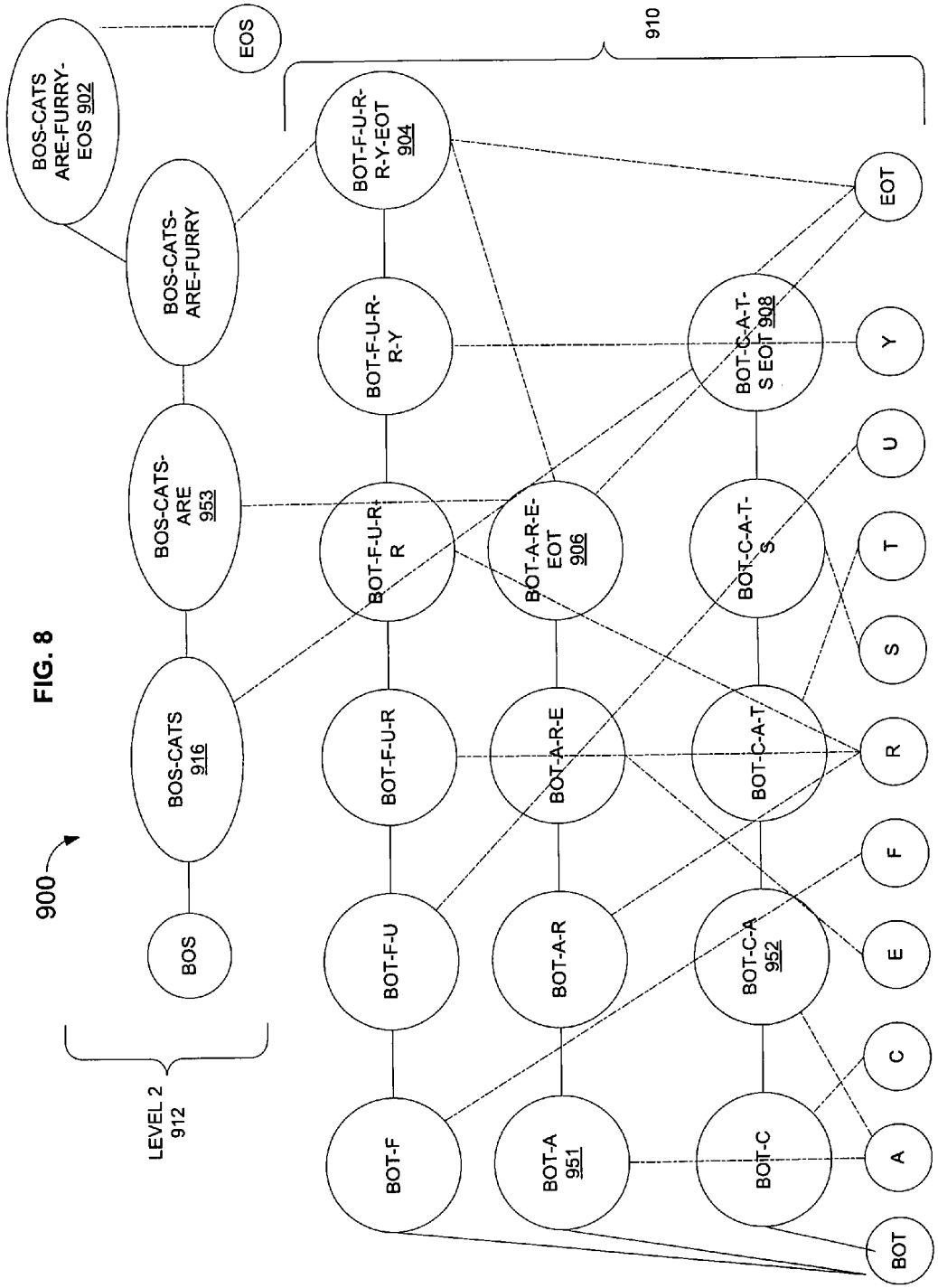
FIG. 8 illustrates a node diagram of a KStore structure in accordance with embodiments of the invention.

As is described in earlier filed patents and as illustrated in FIG. 8, each level (e.g., level 1 910 and level 2 912) of the tree-based datastore 900 comprises a first tree that depends from a first root node and may include a plurality of branches. The first root may represent a concept, such as but not limited to, a level begin indicator. Each of the branches of the first tree ends in a leaf node. Each leaf node may represent an end product. A second root of the same level of the tree-based datastore is linked to each leaf node of the first tree that represents an end product. Hence, the second root is essentially a root to an inverted order of the first tree or subset of the first tree, but the first tree is not duplicated. The second root may represent a concept, such as but not limited to, a level end indicator. Finally, the tree-based datastore comprises a plurality of trees in which the root node of each of these trees may include data such as a dataset element or a representation of a dataset element. This type of root node is referred to herein as an elemental root node. The elemental root node of each of these trees may be linked to one or more nodes in one or more branches of the unduplicated first tree. The non-root nodes of the tree-based datastore essentially contain only pointers to other nodes in the tree-based datastore, and may contain additional fields wherein one such additional field may be a count field. The roots of the trees in the forest of trees comprising each level of the tree-based datastore are also comprised of pointers, however the root nodes may, in addition, contain data that represents information (i.e., contain data that is or represents data such as dataset elements or concepts such as level begin or level end indicators); all the other nodes of the tree-based datastore only point to other nodes and contain essentially no data. As an example, the data may be an integer that is associated with a character, a pixel representation, a condition such as begin indicator, end indicator, beginning of field indicator or the like, although the invention is not so limited. Multiple levels of the above-described tree-based datastore may be generated and accessed; the end products of a lower level becoming the elemental root nodes of the next level.

Thus, the interlocking trees datastore comprises a multi-rooted tree of asCase branches forming one as-Case tree depending from a first root and asResult branches forming multiple asResult trees depending from multiple roots. One special instance of an asResult Tree comprises a root node that is linked to one or more end product leaf nodes of the asCase tree described above. Hence this asResult tree can easily access the branches of the asCase tree terminating in end products, in inverted order. This asResult tree can also be used to define elemental root nodes for the next level. These elemental root nodes may represent dataset elements for the next level, composed of the set of end products of the lower level.

The interlocking trees datastore may capture information about relationships between dataset elements encountered in an input file by combining a node that represents a level begin indicator and a node that represents a dataset element to form a node representing a subcomponent. A subcomponent node may be combined with a node representing a dataset element to generate anther subcomponent node in an iterative sub-process. Combining a subcomponent node with a node representing a level end indicator may create a level end product node. The process of comibing a level begin node with a dataset element mode to create a subcomponent and combing a subcomponent with a dataset element node and so on may itself be iterated to generate multiple asCase branches in a level. AsResult trees may also be linked or connected to nodes in the asCase tree, such as, for example, by a root of an asResult tree pointing to one or more nodes in the asCase tree.

End product nodes of one level may be the elemental root nodes representing dataset elements that are combined to generate a next level of subcomponents. The process can be repeated any number of times, creating any number of levels of asCase trees. Additionally, elemental root nodes of a level may be decomposed to generate lower level nodes and roots. End product nodes of one level become the elemental root nodes of the next level through a special instance of an asResult tree of the lower level, that is, the asResult tree of the lower level having the root node that represents the lower level ending indicator. The asResult tree of the lower level having the root node that represents the lower level ending indicator, thus, is a second root into an inversion of the asCase tree of the lower level.

In some embodiments of the invention, as nodes are created, asCase and asResult links are essentially simultaneously generated at each level. AsCase branches are created by the generation of the asCase links as the input is processed. The asCase branches of the asCase tree on each level provide a direct record of how each subcomponent and end product of the level was created through the sequential combination of nodes representing dataset elements into subcomponent and so on to end products. The branches of the asCase tree also represent one possible hierarchical relationship of nodes in the tree.

The generation of the asResult links creates a series of interlocking trees, each of which depends from a separate root. There may be multiple roots of this type in a level. This has the result of recording all the other relationships between the dataset elements encountered in the input. The aforementioned information is captured by the structure of the forest of interlocking trees that is built rather than explicitly stored in the nodes of the trees, so that in effect the data that is received as input determines the structure of the forest of interlocking trees that is built. The structure of the forest of asResult trees ensures that the information so stored can be accessed in any other context required. Hence, the datastore is self-organizing.

The structure of the nodes themselves is generally maintained through a limited set of data fields per node. There are fields for the Case, the Result, the asCase list pointer, the asResult list pointer and additional fields including at least a count field in most forms of the structure, as well as a value field for each elemental root node.

Note that the K of FIG. 8 begins at a level of letters, and shows a second level of words. Each letter may be considered a "sensor" that is, each letter can be recognized as a particle. Adding each new letter allows for continued growth of the K. The K of FIG. 8 illustrates one possible submission of data: the three words in the following order, "CATS" "ARE" "FURRY". Suppose that the K of FIG. 8 accepts letters as particles. Accordingly, the Learn Engine providing an interface to the K Engine for this K must produce letters as particles. A first particle is "C." The node representing this particle will be located within the elemental root nodes. To record this as an event the elemental root node for "C" will be brought into relation with the current location pointer in K, which in this case is the BOT (Beginning Of Thought) node. Because this is the first occurrence of "C", a new node will be created representing BOT-C. The next particle will be A, and it will be accompanied by a pointer to the BOT-C node. The K Engine will go through the asCase list and for each of the subcomponent nodes on the asCase list of the BOT-C node and for each node it will look at the Result node to see if it matches and use that subcomponent to reset the current location pointer. In this case there are no nodes in the asCase list and it will not have found a match, so the K Engine will record this event as BOT C-A 952, a new subcomponent node, and put this new subcomponent node on the asCase list of the original location counter. The new subcomponent's address will then be set as the new current location. More precisely, The K Engine will see that there are no occurrences of A following BOT-C in the current structure and that a new node (node 952) will be required to record this particle event as BOT C-A. The next particle will be a T, and the record will be the new node presenting BOT C-A-T and so on until the end of the word is reached, creating an end-product node, such as node 908, BOT-C-A-T-S EOT (EOT signifies End-Of-Thought).

Figure 7:
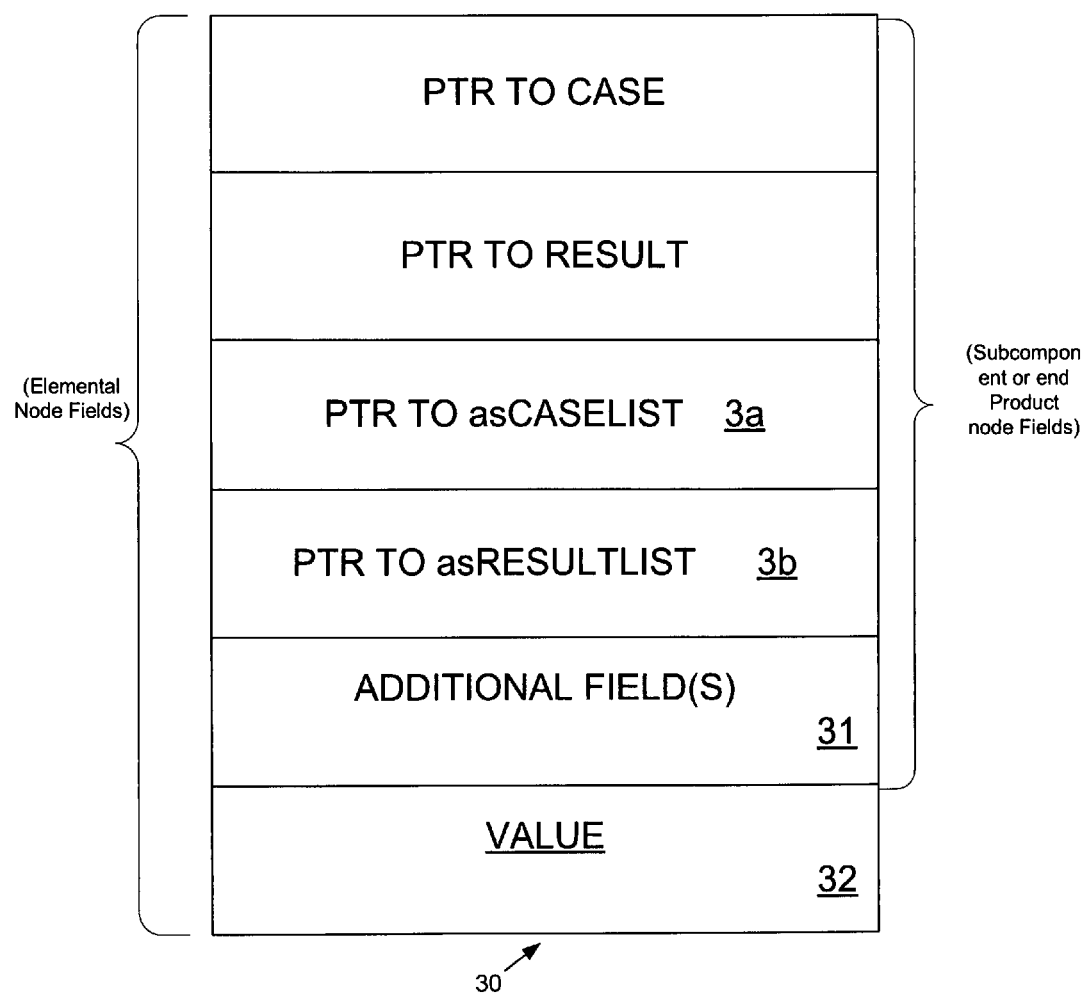
FIG. 7 illustrates a generalized node data structure of a KStore data structure in accordance with embodiments of the invention.

The nodes of the interlocking trees datastore will typically have a form as in FIG. 7 which illustrates the data fields of a typical node 30. Node 30 may include a string field, as the additional field 31, that contains a sequence that shows all of the elemental root nodes represented by this node. The addition of a string field including this sequence of elementals is helpful in debugging. There can be many uses for such additional fields and the nodes such as node 30 need not be limited to one additional field. Further, it will be appreciated that the pointer to asResult list field 3*b* will be null for all subcomponent nodes and that the pointer to asCase List field 3*a* will be null for the elemental nodes and for endproduct nodes. The exemplary node 30 may also include a count field as an additional field 31. The count field is initialized and incremented with an intensity variable, whose value varies with conditions at times when the count field is being referenced. (An intensity variable is defined as a mathematical entity holding at least one unchangeable value). By making this term so broad the intensity variable populated count field can be used for applications of the inventive interlocking trees structure to processes dealing with forgetting erroneous recorded data, recording which entity is doing the inquiry, recording the type of inquiry being used, and other processes of interest which may be derived when using the data. A simple example form of an intensity variable would be a single ordinal field value, such as '1' to be used to increment or decrement count fields to record the number of times that a node has been accessed or traversed. If the node were an elemental root node it would also contain a value field 32. Most of this node construction is already discussed in prior applications U.S. Pat. Nos. 7,158,975 and 6,961,733, incorporated by reference above.

Figure 5:
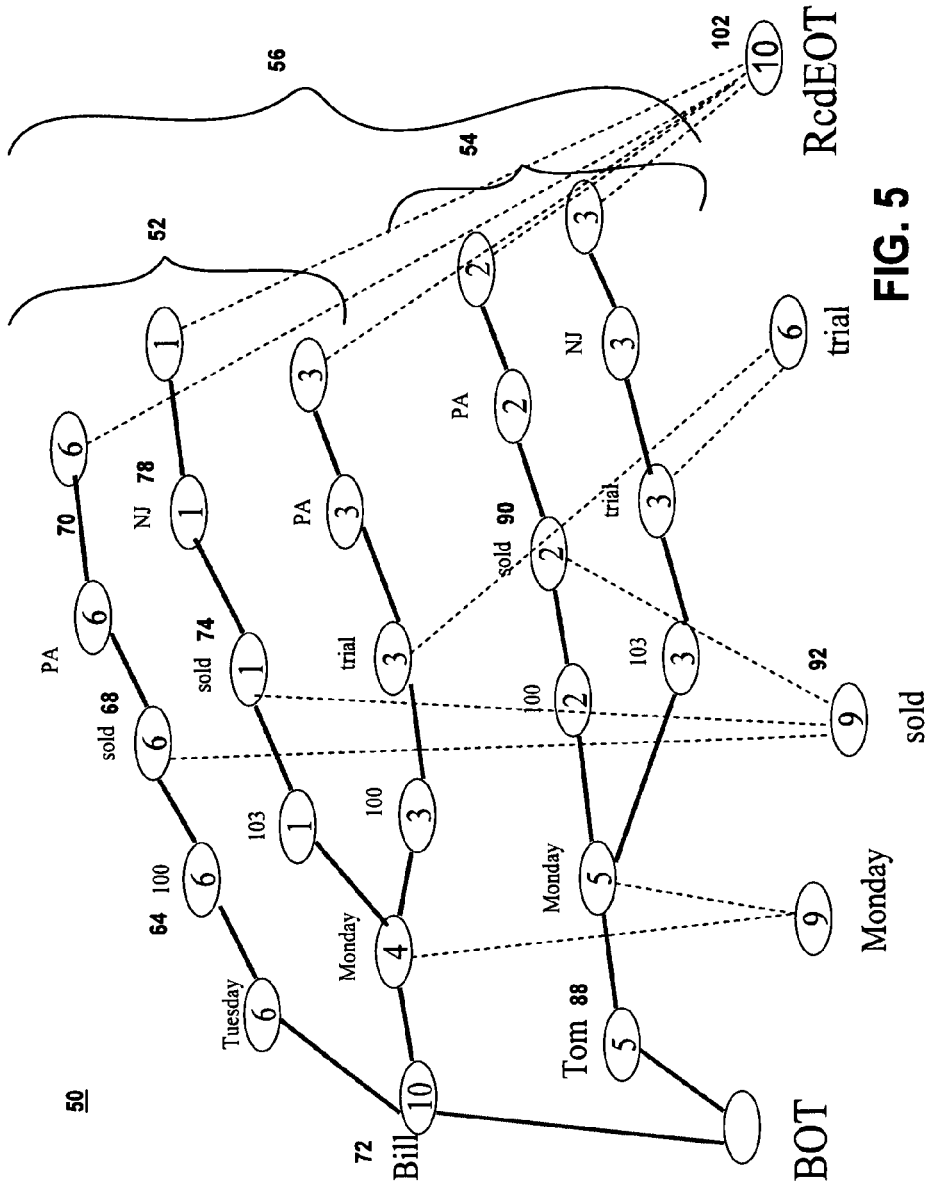
FIG. 5 represents an interlocking trees datastore created from single-scenario data, as described with respect to FIG. 2, in accordance with some embodiments of the invention.

FIG. 5 illustrates an interlocking trees datastore 50. The interlocking trees datastore 50 is a diagrammatic representation of a KStore such as KStore 140 of FIGS. 2*b* and 2*c*. Aspects of the structure, functioning, creation and traversal of the interlocking trees datastore 50 is described in more detail in U.S. Pat. Nos. 6,961,733, and 7,158,975 and in the other patents and patent applications mentioned above. In FIG. 5, data records such as the data records shown in Table I below can be created by a data simulator or data simulators such as data simulators 126, 128 as directed by the declaratives file, and may represent datastream 134 or 136.

TABLE I

| |
|---|
| Bill Tuesday 100 sold PA |
| Bill Tuesday 100 sold PA |
| Bill Tuesday 100 sold PA |
| Bill Tuesday 100 sold PA |
| Bill Tuesday 100 sold PA |
| Bill Tuesday 100 sold PA |
| Bill Monday 103 sold NJ |
| Bill Monday 100 trial PA |
| Bill Monday 100 trial PA |
| Bill Monday 100 trial PA |

TABLE I-continued

| |
|---|
| Tom Monday 100 sold PA |
| Tom Monday 100 sold PA |
| Tom Monday 103 trial NJ |
| Tom Monday 103 trial NJ |
| Tom Monday 103 trial NJ |

The fifteen data records of Table I may represent, for example, fifteen sales transactions handled by salemen Bill and Tom. This information may be stored as shown in the KStore datastore 50. It will be appreciated that all of the data in Table I, the datastream and the datastore 50 have the same data format, and represent a single scenario. Thus, the datastore 50 may represent a single data source and context, the transactions scenario and may result from a single scenario definition in the declarative file (e.g., a scenario named transactions). Accordingly, the datastore 50 may be referred to as a single scenario datastore. The presence of fifteen data records in the datastore 50 is indicated by the count of the end-of-thought node 94 which is the sum of the counts of all end product nodes (i.e., 6+1+3+2+3) within the datastore 50. It will be understood that the term "transactions" as used here includes both the "trial" and "sold" data records. It will be appreciated that while the datastore illustrated is necessarily tiny to aid in understanding, an actual datastore may be immense.

The paths representing the fifteen transactions of Table I within the interlocking trees datastore 50 include paths that contain "Bill" (paths 52) and paths that contain "Tom" (paths 54). The "Bill" paths 52 are understood to include all of the paths extending from the "Bill" subcomponent node 72. The "Tom" paths 54 are understood to include all of the paths extending from the BOT node through the "Tom" subcomponent node 88. The "Bill" paths 52 and "Tom" paths 54 are collectively referred to as the scenario simulator process paths 56 of the interlocking trees datastore 50. Datastore 50 may be built from one or more datastreams generated by one or more threads of one or more data simulators. The paths forming the scenario simulator process paths 56 therefore may constitute a representation of a single scenario, such as sales transactions for a retail furniture store that has two salesmen named Bill and Tom. In more complex scenarios, the data may be in multiple formats, generated from multiple data simulators.

Using the interlocking trees datastore 50 it is possible to determine, for example, that Bill sold six items or units on Tuesday in Pennsylvania by referring to Case path 70 within Bill's paths 52. Furthermore, it is possible to determine that he sold one on Monday in New Jersey by referring to path 78. Additionally, it is possible to determine the total number of items sold by either Bill or Tom by determining the number of times 'sold' is used within the interlocking trees datastore 50. This information can be determined by obtaining the count of the sold elemental root node 92. The count of the sold elemental root node 92 is nine (6 (reference numeral 68)+1 (reference numeral 74)+2 (reference numeral 90).

It will be appreciated that seven of the nine instances of 'sold' occur in Bill's paths 52, and that the remaining two instances occur in Tom's paths 54. In fact, it is an important feature of the interlocking trees datastore 50 that as the data structure is built, the data is automatically being analyzed, so that as the data structure is being built, query solutions are also built into the data structure automatically. An elemental root node such as the sold elemental root node 92 can be used in various different paths of a datastore 50 regardless of the logical relationship, or lack of a logical relationship, between the various paths.

Figure 6:
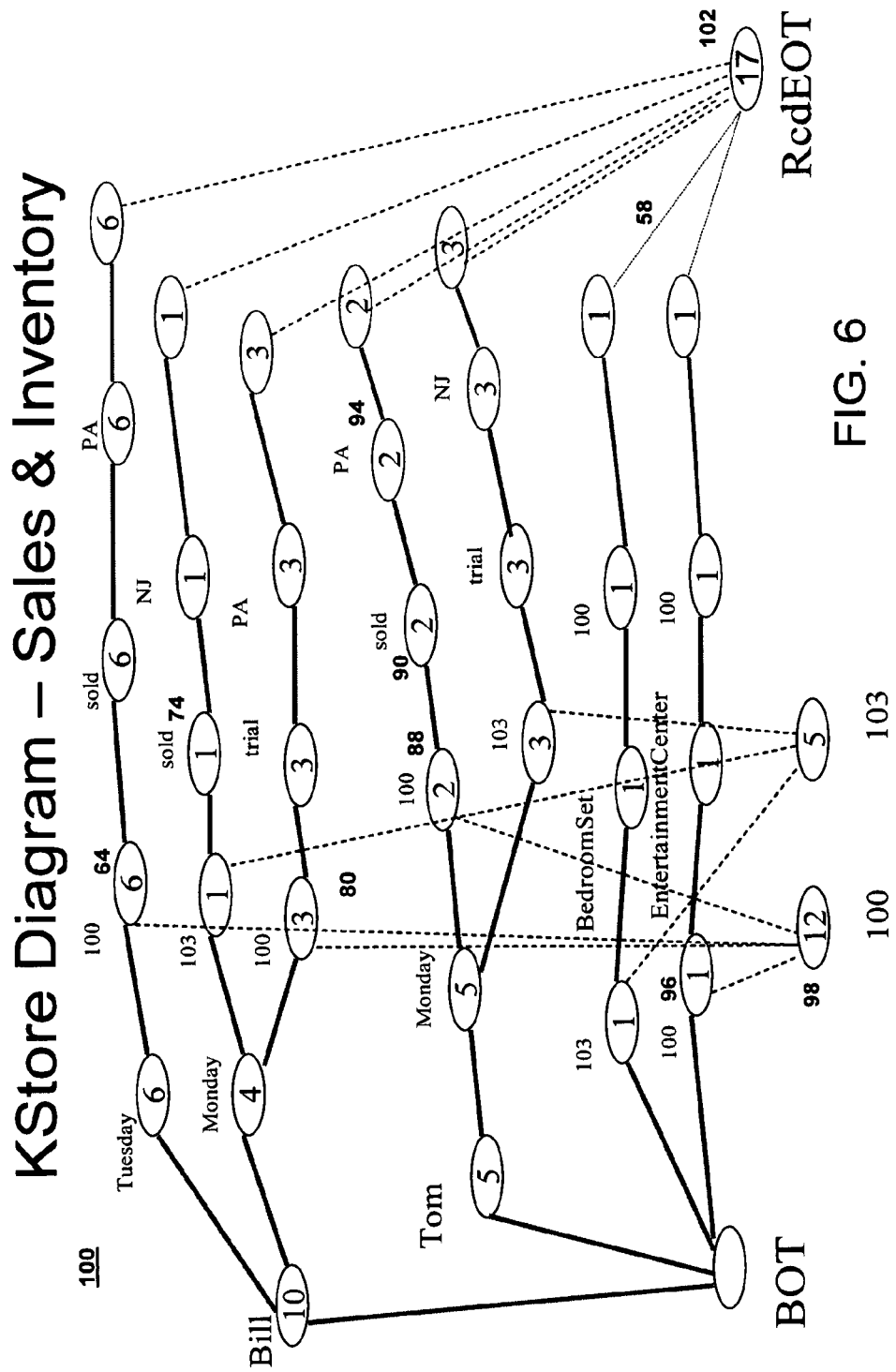
FIG. 6 represents an interlocking trees datastore created from multiple-scenario data, as described with respect to FIG. 2, in accordance with some embodiments of the invention.

FIG. 6 represents interlocking trees datastore 100. Within the interlocking trees datastore 100 in addition to Bill's paths 52 extending from the "Bill" subcomponent node 72 and Tom's paths 54 extending from the "Tom" subcomponent node 88 comprising the transactions scenario, the interlocking trees datastore 100 also includes paths 58, referred to as the inventory scenario. That is, KStore 140 is represented in FIG. 6 as the interlocking trees datastore 100 and includes both transaction information and inventory information. The inventory information is shown in Table II below.

TABLE II

| 103 | BedroomSet 50 |
|-----|---------------|
| 100 | EntertainmentCenter 60 |

It will be appreciated that the transaction information and the inventory information are in two different data formats. In some embodiments of the invention, a datastore such as datastore 100 is built from multiple datastreams generated by multiple data simulators based on a plurality of scenario definitions in the declarative file. The addition of the two records shown in Table II to the interlocking trees datastore 100 causes the count of the end of thought node to rise from fifteen, for the end of thought node 94 of the interlocking trees datastore 50, to seventeen, for the end of thought node 102. Fifteen of the seventeen records in the interlocking trees datastore 100 are from the transaction scenario and two are from the inventory scenario. In some embodiments of the invention, the data record of Tables I and II could be provided with a field having two valid variables representing transactions and inventory in order to create the interlocking trees datastore 100.

Within the interlocking trees datastore 100, elemental root node 98 represents the number "100." The elemental root node 98 has a count of twelve, indicating that "100" occurs a total of twelve times in the datastore 100. Eleven of the twelve occurrences of "100" are in the scenario simulator path 56: nine are in Bill's paths 52 (see subcomponent nodes 64, 80) and two are in Tom's paths 54 (see subcomponent node 88). The one remaining occurrence of the number '100' represented by elemental root node 98 comes from the inventory scenario data 58 (see subcomponent node 96). Thus, the number "100" is used in the data from both scenarios. Furthermore, it may be used in different ways in the different scenarios. For example, in the scenario data, the number "100" can indicate a value of a transaction, for example $100.00. In the inventory scenario it can indicate an item number and thus the identity of the item that is being inventoried. Thus, it will be appreciated that particles or sequences represented by an elemental root node (or root node, depending on the level perspective of the view of K) in the system and method of the present invention can be used in data representing a plurality of different scenarios to represent entirely different types of variables.

The nodes of the interlocking trees datastore will typically have a form as illustrated in FIG. 7 which illustrates the data fields of a typical node 30. Node 30 may include a string field, as the additional field 31, that contains a sequence that shows all of the elemental root nodes represented by this node. The addition of a string field including this sequence of elementals is helpful in debugging. There can be many uses for such additional fields and the nodes such as node 30 need not be limited to one additional field. Further, it will be appreciated that the pointer to asResult list field 3b will be null for all subcomponent nodes and that the pointer to asCase List field 3a will be null for the elemental nodes and for endproduct nodes. The exemplary node 30 may also include a count field as an additional field 31. The count field is initialized and incremented with an intensity variable, whose value varies with conditions at times when the count field is being referenced. (An intensity variable is defined as a mathematical entity holding at least one unchangeable value). By making this term so broad the intensity variable populated count field can be used for applications of the inventive interlocking trees structure to processes dealing with forgetting erroneous recorded data, recording which entity is doing the inquiry, recording the type of inquiry being used, and other processes of interest which may be derived when using the data. A simple example form of an intensity variable would be a single ordinal field value, such as '1' to be used to increment or decrement count fields to record the number of times that a node has been accessed or traversed. If the node were an elemental root node it would also contain a value field 32. Most of this node construction is already discussed in prior applications U.S. Pat. Nos. 7,158,975 and 6,961,733, incorporated by reference above.

The various techniques described herein may be implemented in connection with hardware or software or, where appropriate, with a combination of both. Thus, the methods and apparatus of embodiments of the invention, or certain aspects or portions thereof, may take the form of program code (i.e., digitally encoded instructions) embodied in tangible media, such as floppy diskettes, CD-ROMs, hard drives, or any other machine-readable storage medium, wherein, when the program code is loaded into and executed by a machine, such as a computer, the machine becomes an apparatus for practicing the invention. In the case of program code execution on programmable computers, the computing device will generally include a processor, a storage medium readable by the processor (including volatile and non-volatile memory and/or storage elements), at least one input device, and at least one output device. One or more programs that may utilize the creation and/or implementation of domain-specific programming models aspects of embodiments of the invention, e.g., through the use of a data processing API or the like, may be implemented in a high level procedural or object oriented programming language to communicate with a computer system. However, the program(s) can be implemented in assembly or machine language, if desired. In any case, the language may be a compiled or interpreted language, and combined with hardware implementations.

While embodiments of the invention have been described in connection with the figures, it is to be understood that other similar embodiments may be used or modifications and additions may be made to the described embodiments for performing the same functions without deviating there from. Therefore, the invention should not be limited to any single embodiment, but rather should be construed in breadth and scope in accordance with the appended claims.

What is claimed is:

1. A computing system for generating scenario data having a programmable processor and computer readable memory for storing programmable instructions that are executable by the programmable processor, the system comprising:
    a scenario simulator processor that receives a declarative file characterizing a data universe and initiates at least one of a plurality of data simulators, wherein each data simulator generates at least one of a plurality of scenario datastreams based on the received declarative file, wherein the plurality of scenario datastreams are processed by a K Engine to generate a KStore representing the data universe characterized by the declarative file, wherein the KStore comprises a set of interlocking trees comprising a multi-rooted tree of asCase branches forming an asCase tree depending from a first root and asResult branches forming multiple asResult trees depending from multiple roots, wherein an asResult tree comprising a second root node linked to an end product leaf node of the asCase tree accesses the branches of the asCase tree terminating in end products, in inverted order.

2. The system of claim 1, wherein the declarative file is an XML file.

3. The system of claim 1, wherein the declarative file specifies a number of execution threads to be initiated, wherein the specified number of execution threads execute in real time and simultaneously to generate a number of datastreams equal to the specified number of execution threads.

4. The system of claim 1, wherein the declarative file comprises an identifier for at least one scenario of a plurality of scenarios and a set of scenario simulator specifications for the at least one scenario.

5. The system of claim 4, wherein the set of scenario simulator specifications comprises settings or parameter data for a data simulator, wherein the data simulator generates at least one datastream of scenario data as directed by the declarative file.

6. The system of claim 4, wherein the data simulator is a first simulator, the first simulator producing a first datastream of a first format and wherein a second data simulator generates a second datastream of a second format different than the first format.

7. The system of claim 6, wherein the first datastream and the second datastream are processed simultaneously in real-time by the K Engine.

8. A method for generating scenario data comprising:
specifying parameters and settings for a scenario for a first scenario data simulator, wherein the specified parameters and settings represent characteristics of a data universe;
adding the specified parameters and settings to a declarative scenarios file;
starting the first scenario data simulator, wherein the first scenario data simulator generates a first datastream of a first format, the first format specified by the declarative scenarios file; and
generating a KStore data structure, wherein the KStore comprises a data structure representing the scenario specified by the declarative scenarios file, and wherein the KStore comprises a set of interlocking trees comprising a multi-rooted tree of asCase branches forming an asCase tree depending from a first root and asResult branches forming multiple asResult trees depending from multiple roots, wherein an asResult tree comprising a second root node linked to an end product leaf node of the asCase tree accesses the branches of the asCase tree terminating in end products, in inverted order.

9. The method of claim 8, wherein the declarative scenarios file comprises an XML file, wherein the XML file specifies a name for the scenario, and a name for a file comprising the parameters and settings characterizing the data universe.

10. The method of claim 9, wherein the specified scenario is a first scenario and the name of the file comprising the parameters and settings is a first parameters and settings file and the XML file specifies a second scenario, and a second parameters and settings file.

11. The method of claim 10, wherein a second scenario data simulator generates a second datastream of the first format or of a second format different than the first format.

12. The method of claim 11, wherein the second datastream is processed by the K Engine to generate the KStore data structure, wherein the KStore data structure represents the second scenario.

13. The method of claim 8, further comprising generating the first datastream, wherein the first datastream comprises data based on the declarative file.

14. A computer-readable storage medium including digitally encoded data readable by a processing system comprising a declarative file, wherein the declarative file specifies a scenario modeling a user scenario to be generated, wherein the scenario is specified by a set of parameters and settings, wherein the set of parameters and settings is provided to a scenario data simulator, wherein the set of parameters and settings represent characteristics of a data universe to be generated by the scenario data simulator, from which a KStore data structure is generated, wherein the KStore data structure comprises a set of interlocking trees comprising a multi-rooted tree of asCase branches forming an asCase tree depending from a first root and asResult branches forming multiple asResult trees depending from multiple roots, wherein an asResult tree comprising a second root node linked to an end product leaf node of the asCase tree accesses the branches of the asCase tree terminating in end products, in inverted order.

15. The computer-readable storage medium of claim 14, wherein the declarative file is an XML file, and wherein the scenario specified in the XML file is a first scenario modeling a first user scenario, the set of parameters and settings is a first set of parameters and settings, the scenario data simulator is a first scenario data simulator and the data universe is a first data universe and wherein the XML file also specifies a second scenario modeling a second user scenario to be generated, wherein the second scenario is specified by a second set of parameters and settings, wherein the second set of parameters and settings is provided to a second scenario data simulator, wherein the second set of parameters and settings represent characteristics of a second data universe to be generated by the second scenario data simulator.

16. The computer-readable storage medium of claim 15, wherein the first scenario in the XML file specifies a first file in which the first set of parameters and settings is stored and wherein the second scenario in the XML file specifies a second file in which the second set of parameters and settings is stored.

17. The computer-readable storage medium of claim 16, wherein the first file in which the first set of parameters and settings is stored and wherein the second file in which the second set of parameters and settings is stored are not the same file.

18. The computer-readable storage medium of claim 16, wherein the first set of parameters and settings is not identical to the second set of parameters and settings.

19. The computer-readable storage medium of claim 14, wherein the XML file specifies another file in which the set of parameters and settings is stored.

* * * * *